United States Patent
Cohn et al.

[11] Patent Number: 5,948,193
[45] Date of Patent: Sep. 7, 1999

[54] PROCESS FOR FABRICATING A MULTILAYER CERAMIC SUBSTRATE FROM THIN GREENSHEET

[75] Inventors: Michael A. Cohn, Ramsey, N.J.; Jon A. Casey; Christopher N. Collins, both of Poughkeepsie, N.Y.; Robert A. Rita, Wappingers Falls, N.Y.; Robert J. Sullivan, Pleasant Valley, N.Y.; Adrienne M. Tirch, Poughkeepsie, N.Y.; Leslie J. Wiands, Hyde Park, N.Y.; Ryan W. Wuthrich, Fishkill, N.Y.

[73] Assignee: International Business Machines Corporation, Armonk, N.Y.

[21] Appl. No.: 08/886,032

[22] Filed: Jun. 30, 1997

[51] Int. Cl.⁶ .................................................. B32B 31/26
[52] U.S. Cl. .................................. 156/89.16; 156/89.12; 264/619; 264/620; 264/657
[58] Field of Search ............................. 156/89.12, 89.16, 156/246; 264/615, 619, 620, 656, 657; 29/851; 428/210, 901

[56] References Cited

U.S. PATENT DOCUMENTS

| | | |
|---|---|---|
| 2,108,513 | 2/1938 | Shardlow . |
| 2,966,719 | 1/1961 | Park, Jr. . |
| 3,698,923 | 10/1972 | Stetson et al. . |
| 3,988,405 | 10/1976 | Smith et al. . |
| 4,045,412 | 8/1977 | Yamada et al. . |
| 4,302,498 | 11/1981 | Faith, Jr. . |
| 4,340,635 | 7/1982 | Langman et al. . |
| 4,567,542 | 1/1986 | Shimada et al. . |
| 4,582,813 | 4/1986 | Kanda et al. . |
| 4,595,665 | 6/1986 | Takayama et al. . |
| 4,641,425 | 2/1987 | Dubuisson et al. . |
| 4,769,294 | 9/1988 | Barringer et al. . |
| 4,888,311 | 12/1989 | Davidovits et al. . |
| 4,980,236 | 12/1990 | Oomen et al. . |
| 5,043,223 | 8/1991 | Kumagai et al. . |
| 5,057,360 | 10/1991 | Osaka et al. . |
| 5,065,275 | 11/1991 | Fujisaki et al. . |
| 5,099,388 | 3/1992 | Ogawa et al. . |
| 5,144,526 | 9/1992 | Vu et al. . |
| 5,266,536 | 11/1993 | Egerton et al. . |
| 5,387,474 | 2/1995 | Mikeska et al. . |
| 5,431,971 | 7/1995 | Allegret et al. . |
| 5,580,832 | 12/1996 | Malghan et al. . |
| 5,711,833 | 1/1998 | Apte et al. . |
| 5,753,160 | 5/1998 | Takeuchi et al. ............... 264/620 X |
| 5,757,611 | 5/1998 | Gurkovich et al. ............. 361/321.4 |
| 5,766,394 | 6/1998 | Anderson et al. ............... 156/89.11 |

*Primary Examiner*—Curtis Mayes
*Attorney, Agent, or Firm*—Delio & Peterson LLC; John J. Tomaszewski; Ira D. Blecker

[57] ABSTRACT

Greensheets having enhanced flexibility and strength are prepared from a greensheet casting composition comprising alumina or other ceramic having a mean particle size of less than about 1 micron and being substantially unimodal, a binder resin, a solvent system and a plasticizer. The greensheets may be formed having a thickness of about 50 microns using conventional greensheet fabricating devices. The greensheets are particularly suitable as dielectric layers for internal layer capacitors in a multilayer ceramic substrate. A preferred co-sintering heating profile to avoid blistering of the MLC package is also provided to form the capacitor containing MLC.

5 Claims, 1 Drawing Sheet

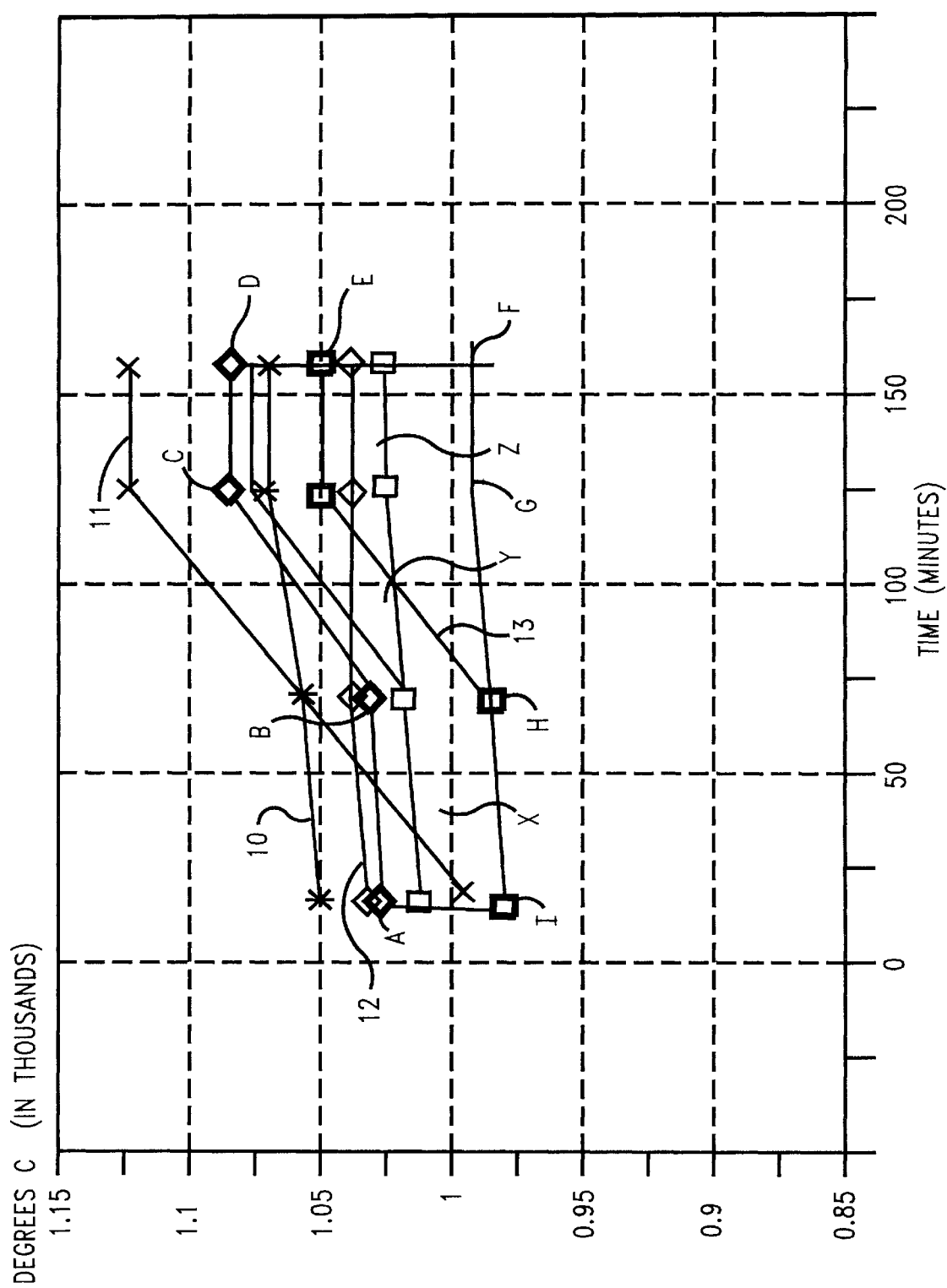

PROCESS FOR FABRICATING A MULTILAYER CERAMIC SUBSTRATE FROM THIN GREENSHEET

BACKGROUND OF THE INVENTION

1. Field of the Invention

The present invention relates to compositions and methods for forming flexible ceramic articles termed greensheets and, in particular, thin greensheets having a thickness of about 10–75 microns and for forming the greensheets into multilayer ceramic (MLC) substrates including MLC substrates having an interlayer capacitor and, in particular, to a composition comprising a ceramic having a defined particle size and particle size distribution and to a specially defined heating (sintering) profile to form the MLC which heating profile effectively removes the organics used to make the greensheets.

2. Description of Related Art

Ceramics have found widespread use in electronics as a substrate for integrated circuit packages. Metallized circuit patterns are applied to the ceramic substrate in the form of a greensheet, and ceramic and metallization are co-sintered to create a monolith of substrate and circuitry. Multi-layer circuit packages are constructed by combining ceramic particles and organic binders into unfired, or "greensheet", tape. Inter-layer conductive paths, known as "vias", are then inserted (punched) through the layers, forming electrical interconnections between the circuits on each layer after they are stacked and processed. Metallized circuit patterns are applied to the punched greensheets as is well-known in the art. The greensheet tape layers typically have a thickness ranging from 125 to 625 microns. Multiple layers of punched and metallized tape are stacked and laminated under pressure. The ceramic and metallization laminate is then co-sintered to form a monolithic structure with three-dimensional circuitry.

The casting of suspensions of ceramic material to form layers or sheets which are then sintered to produce a ceramic substrate material is known in the art. The doctor blade method is one method for producing a ceramic greensheet. Typically, ceramic powder is mixed with an organic solvent, a plasticizer and a binder forming a slurry, the slurry is cast in a regulated thickness on a carrier film with the aid of a doctor blade, and the applied layer of the slurry is then dried. The ceramic formula is typically alumina and a butyral type resin like polyvinyl butyral. A cellulose type resin like ethyl cellulose or polyvinyl alcohol is also typically used as the binder.

A capacitor can be formed within the multilayer substrate by sandwiching an inner dielectric layer between a pair of electrodes. In such an integrated capacitor substrate, conductor pads are formed on the top sheet and wirings are formed within the substrate to connect the capacitor and the pads. U.S. Pat. Nos. 4,567,542; 5,065,275 and 5,099,388 show such MLC's having internal capacitors and the patents are hereby incorporated by reference.

The capacitor containing multilayer substrate is likewise manufactured by a greensheet laminating technique as described above. Alumina and glass are typically used as the ceramic component of the greensheet for both the insulating layers and dielectric layers. The laminated greensheets are typically sintered or fired at a temperature of about 1,500° C. or higher. In view of the high sintering temperature, the vias and wiring must be made of molybdenum, tungsten, or a like conductor material having a high melting point.

In order to build a capacitor within the MLC to provide the electrical capacitance, a dielectric layer must be placed between two electrode layers. Since the capacitance is inversely proportional to the thickness of the dielectric layer, a thin dielectric layer is required for higher capacitance. The thinner a MLC dielectric greensheet is, however, the more difficult it is to process. Some of the processes that a greensheet needs to undergo to fabricate an MLC are spooling after casting, blanking greensheets from the cast tape, via punching, greensheet stacking, and the handling of the tape/sheets during each process. A thin tape made of conventional materials yields a tape that is very difficult to blank into greensheets. The greensheets are difficult to process at punching and stacking since they rip or tear due to their poor mechanical properties. A greensheet having high strength and flexibility is therefore very desirable.

Another problem arises when the layers have different ceramic compositions such as the dielectric ceramic layer used to form the capacitor and the ceramic and glass layers of the multilayer substrate. When different ceramic material layers are laminated and sintered to form MLC, it is typically termed co-sintering. Problems such as blistering can occur during co-sintering due to the release of gaseous organic materials formed during removal of the binder and other organics from the greensheet layer. Basically, the gases collect and the volume of the gas increases as the temperatures rise during the sintering process. The result is the formation of blisters in the thin layer material causing surface perturbations making the surface of the MLC non-planar and, therefore, unacceptable.

Bearing in mind the problems and deficiencies of the prior art, it is therefore an object of the present invention to provide a ceramic greensheet casting composition which provides greensheets having enhanced strength and flexibility properties.

It is another object of the present invention to provide a ceramic greensheet having enhanced strength and flexibility properties.

A further object of the invention is to provide a process for producing a ceramic substrate greensheet wherein the greensheet has enhanced strength and flexibility properties.

It is yet another object of the present invention to provide a process for fabricating a multilayer ceramic substrate from greensheets including multilayer ceramic substrates having an inner capacitor.

It is still yet another object of the present invention to provide a process for fabricating a multilayer ceramic substrate having the same or different ceramic composition greensheet layers using a specially defined heating procedure which minimizes the formation of blisters in the multilayer ceramic product.

Another object of the present invention is to provide greensheets and multilayer ceramic substrates made from the greensheets using the compositions and/or processes of the invention.

Still other objects and advantages of the invention will in part be obvious and will in part be apparent from the specification.

SUMMARY OF THE INVENTION

The above and other objects, which will be apparent to those skilled in the art are achieved by the present invention which in a first aspect relates to a ceramic greensheet casting composition preferably non-aqueous and preferably not containing any glass, e.g. less than about 5% by weight, preferably less than 1% and most preferably less than 0.5%, e.g., substantially 0%, comprising alumina or other ceramic in particulate form having a mean particle size of less than about 1 micron and being substantially unimodal (having essentially a single peak in a plot of particle size distribution), a binder resin, a solvent system and a plasticizer.

The ceramic is preferably alumina and the mean particle size is preferably about 0.3 to 0.6 microns with the standard deviation being about ±0.25 micron. Such a particle size distribution and having a single peak is considered as having a unimodal particle size distribution and has been found to provide enhanced greensheet, e.g., mechanical properties when used to make the greensheets of the invention.

In another aspect, the present invention relates to a ceramic sheet and multilayer ceramic substrate made by heating a ceramic greensheet made from a ceramic greensheet casting composition as described hereinabove. The heating cycle is commonly termed sintering and typically encompasses three (3) distinct heating stages: (1) Pyrolysis up to about 500° C. to remove and break-down molecular species of the polymers used and volatilize the smaller chain organics and to remove unwanted organics; (2) burn binder out (BBO) to remove the remainder of the unwanted organics (particularly the binder) from the greensheet; and (3) sintering to form the greensheet ceramic particles together into a densified ceramic substrate.

In a further aspect of the invention a process for producing a ceramic greensheet comprises the steps of:

forming a ceramic greensheet casting composition comprising alumina or other ceramic having a mean particle size of less than about 1 micron and being substantially unimodal, a binder resin, a solvent system and a plasticizer;

forming a composition layered tape from the ceramic greensheet casting composition; and volatilizing (removing) the solvent from the layered tape forming the greensheet.

In a further aspect of the invention, a process is provided for fabricating a multilayer ceramic substrate comprising the steps of:

stacking layers of greensheets made using the above composition of the invention, the greensheets having metallization thereon and metallized via interconnections; and sintering (heating) the stack to form the multilayer ceramic substrate.

In another aspect of the invention, a process is provided for fabricating a multilayer ceramic substrate having at least one inner capacitor comprising the steps of:

stacking layers of greensheets having metallization thereon and metallized via interconnections, there being at least one dielectric greensheet layer sandwiched between upper and lower electrode layers, the dielectric layer being formed from a ceramic greensheet casting composition comprising alumina or other ceramic having a mean particle size of less than about 1 micron and being substantially unimodal, a binder resin, a solvent system and a plasticizer; and sintering (heating) the stacks to form the multilayer ceramic substrate.

In an additional aspect of the invention, a preferred process is provided for fabricating a multilayer ceramic substrate comprising stacking layers of greensheets made using the above composition of the invention and having metallization thereon and metallized via interconnections; and firing (sintering) the stack to form the multilayer ceramic substrate, the sintering being performed by first pyrolyzing the laminate, followed by a BBO heating profile to remove the remaining organics by heating the laminate within a temperature profile wherein the laminate is maintained for an effective period of time within a particular soak temperature range between about 980° C. to about 1025° C. and, preferably at an essentially even temperature for an effective time to remove carbon, usually about 1–4, e.g., 2–3 hours. This may be followed by ramping the temperature within a temperature range up to about 1075° C. or maintaining the soak temperature until the organics are removed. The heated laminate is then sintered to form the multilayer ceramic substrate. The heating procedure may be effectively used to co-sinter greensheets of different compositions including greensheets used to make a multilayer substrate with internal capacitors wherein a dielectric greensheet layer (no metallization) made using the above greensheet composition is sandwiched between upper and lower metallized greensheets having the same or a different greensheet composition (including glass). The time for the BBO heating cycle may vary and is generally about 2 to 3 hours, or more.

BRIEF DESCRIPTION OF THE DRAWINGS

The features of the invention believed to be novel and the elements characteristic of the invention are set forth with particularity in the appended claims. The figure is for illustration purposes only and is not drawn to scale. The invention itself, however, both as to organization and method of operation, may best be understood by reference to the detailed description which follows taken in conjunction with the accompanying figure in which the figure is a graph showing the preferred heating cycle to remove organics during the part of the heating (sintering) process termed binder burn out (BBO) to form a multilayer ceramic substrate from a greensheet laminate.

DESCRIPTION OF THE PREFERRED EMBODIMENT(S)

In describing the preferred embodiment of the present invention, reference will be made herein the figure. Features of the invention are not necessarily shown to scale in the figure.

The ceramic greensheet casting composition may be made using known techniques as described in U.S. Pat. Nos. 2,966,719 to Park, Jr.; 3,698,923 to Stetson et al.; 4,769,294 to Barringer et al. and 5,387,474 to Mikeska et al., which patents are hereby incorporated by reference. The composition typically termed a casting slip may be prepared by mixing the ingredients in a ball mill for a number of hours such as 8 hours to ensure that a homogeneous mixture is formed and desired viscosity obtained. The alumina having the above particle size and particle size distribution is used to make the casting composition. Alcoa Al6SG and Alcan RAC45B have been found to be suitable. The binder may be selected from a wide variety of polymers such as polyvinyl butyral, polyvinyl alcohol, or an acrylic resin. The binder is preferably polyvinyl butyral. The solvent may also be an selected from the wide variety of materials such as methyl ethylketone (MEK), methyl isobutyl ketone (MIBK), methanol, acetone, toluene, isopropyl alcohol, etc. A plasticizer such as dibutylphthlate is also preferably used in the formulation.

Typically, the slip composition is prepared in a two stage milling process. In the first stage, the ceramic powder and solvent are mixed. In the second stage, the binder and plasticizer are added.

The binder serves to retain the ceramic-particles in undisrupted position after the organic solvent is evaporated from the cast slip. A typical greensheet casting composition by weight % is as follows:

|  | BROAD | PREFERRED |
|---|---|---|
| Ceramic | 40 to 60% | 45 to 55% |
| Binder | 2 to 10% | 4 to 8% |
| Solvent | 20 to 50% | 35 to 45% |
| Plasticizer | 0.5 to 5% | 1 to 2% |

After the ingredients of the casting composition are mixed and homogenized, such as in a ball mill, a slip is formed having a viscosity which may vary from approximately 400 to approximately 2000 centipoise. The slip can be de-aired by means well known in the ceramic art. After de-airing, the slip is transferred to a slip reservoir where it is suitably maintained in a homogenous state. From the reservoir, the slip is discharged through a small orifice onto a substantially-horizontal flexible tape. The flexible supporting tape is typically a tape made of any impervious material, such as polytetrafluoroethylene "Teflon", glycol tetraphthalic acid polyester (Mylar) and the like. The casting sheet is pulled across the open bottom of the reservoir and under a doctor blade, which is set at a particular height to form the desired substrate thickness. The casting sheet should be supported on a smooth surface and then the solvent vaporized producing a leather hard tape (termed a greensheet). The greensheet can then be punched before or after removal of the casting sheet to the desired substrate size.

The sheet may then metallized as described above and stacked to form the desired multilayer ceramic substrate laminate which is then fired (sintered) to the form final MLC product. The dielectric sheet is between two electrodes at all times to form an internal capacitor, and this structure may be further repeated.

It is an important feature of the invention that the greensheets be prepared using the casting composition described above. Using the composition and process of the invention, thin greensheets having a thickness typically between about 10 and 75 microns may be made using conventional equipment because of the enhanced strength and flexibility of the greensheets. The greensheets may also suitably be used as a capacitor layer in a multilayer ceramic substrate.

Sintering of the multilayer ceramic laminate is conventionally performed using any of a number of heating profile cycles. In general, the sintering of ceramic and, especially, alumina based MLC packages, is typically performed in three distinct heating phases. The first phase pyrolysis breaks down large polymers and volatilizes the shorter chain organics. Pyrolysis is usually performed at a temperature below 500° C. for about 5 hours. The heating cycle where the binder and remaining organics are burned out of the package (termed BBO) is usually performed at a temperature above about 900° C., e.g., 1000° C. to 1250° C. ,for about 2 hours. Sintering is then completed at a temperature between 1250° C. and 1500° C. to form the final MLC package. The total heating cycle is typically performed in a sintering environment which is a reducing atmosphere such as hydrogen or nitrogen.

It is an important feature of the invention that a special defined heating profile be used in the BBO heating cycle to form the multilayer ceramic substrates of the invention. The use of this heating cycle is particularly important when a co-sintering process is used where a capacitor of a different greensheet composition particularly made using the composition of the invention is used as a dielectric layer in the multilayer ceramic substrate. It is also important when, for example, a glass containing greensheet is co-sintered with a non-glass containing greensheet. It is hypothesized that the glass becomes sufficiently fluid and interferes with the binder burn out of the thin non-glass layer. In this BBO region, there is a preferred hold temperature above which temperature the glass has a low viscosity which interferes with binder burnout.

Referring to the figure, one heating profile of the invention for the greensheets made using the preferred alumina of the invention and the alumina used in the example below comprises heating the multilayer ceramic substrate after a pyrolysis step within the temperature and time bounds of the area defined by points A, B, C, D, E, F, G, H and I. Temperature profiles indicated by lines 10, 11 and 12 were unsatisfactory and produced blistered multilayer ceramic substrates.

As can be seen from figure, the BBO heating cycle does not employ a high ramping temperature profile during the whole BBO cycle, i.e., the change in temperature per unit time (°C./min) is minimized for the complete cycle. This can be seen from line 11 which used a ramping rate of about 1.1° C./min from the start of the BBO cycle to almost the completion of the BBO cycle over a time period of about 130 minutes. Additionally, the use of a high, relatively even temperature profile over the BBO heating cycle as shown by lines 10 and 12 are likewise unacceptable and would form a blistered MLC package.

The BBO heating cycle of the invention comprises an initial relatively low soak temperature period as shown by area X bounded by points A, B, H and I. The temperature range between points I and A and H and B may vary depending on the greensheet layers being used to form the MLC. For the alumina used in the example below, an initial soak period X of about 1 hour at between about 980° C. and 1025° C. has been effective. In the next BBO heating zone Y, bounded by points B, C, G and H, the temperature can be maintained constant within the 980° C. to 1025° C. range or ramped to the maximum BBO temperature employed in the BBO cycle which is about 1075° C. In the last BBO cycle Z, bounded by points C, D, E, F and G, a soak at a constant temperature within the range 980° C. to 1075° C. is preferred. It is also contemplated herein that the temperature can be ramped in both heating zones Y and Z by, for example, continuing the ramp cycle shown as line 13 through zone X into zone Z.

Accordingly then, the BBO heating cycle comprises three heating zones X, Y and Z. In one BBO heating profile, the temperature may be maintained constant through each zone. In a second BBO heating profile, the temperature may be maintained constant at a low soak temperature in heating zone X, ramped in heating zone Y and maintained constant in heating zone Z. In a third BBO heating profile, the temperature may be maintained constant at a low soak temperature in heating zone X and ramped through heating zones Y and Z. In a less preferred heating profile, the temperature may be ramped through any or each zone X, Y, and Z zones within the temperature constrictions for each zone.

The temperature and time constrictions for the BBO cycle for each MLC product is determined empirically with the preferred cycle such that an initial heating period (shown as X) be at a lower temperature than the final BBO temperature. The initial heating period may generally be referred to as a soak period. It has been found that at typical BBO ramp rates as shown by line 11 that thin layer densification occurs prior to complete organic removal entrapping reaction gases and causing blisters.

EXAMPLE

Ceramic slurry compositions as shown in Table 1 below were formed by mixing the components in a ball mill for about 8 hours. Formulations A and B were made using a commercial alumina having mean particle size of about 3–5 microns. Formulation 1 of the invention was made using the preferred alumina described above.

TABLE 1

| COMPONENT | Formulation (% by weight) | | |
|---|---|---|---|
| | 1 | A | B |
| $Al_2O_3$ | 49.4 | 49.4 | 58.9 |
| Glass Frit | 0 | 0 | 3.9 |
| $TiO_2$ | 0 | 0 | 0.5 |
| $Cr_2O_3$ | 1 | 1 | 2 |
| Solvent | 42.6 | 42.6 | 29.4 |
| Plasticizer | 1.1 | 1.1 | 1.5 |
| Polyvinyl butyral | 5.8 | 5.8 | 4.2 |

Greensheets were prepared and had the compositions and properties shown in Table 2 after drying. The greensheets were prepared as follows by tape casting with a commercial doctor blade using a polymer carrier film.

TABLE 2

| COMPONENT | Formulation (% by weight) | | |
|---|---|---|---|
| | 1 | A | B |
| $Al_2O_3$ | 86.2 | 86.2 | 83.0 |
| Glass Frit | 0 | 0 | 5.5 |
| $TiO_2$ | 0 | 0 | 0.7 |
| $Cr_2O_3$ | 1.7 | 1.7 | 2.8 |
| Plasticizer | 1.9 | 1.9 | 2.1 |
| Polyvinyl Bolyral | 10.2 | 10.2 | 5.9 |
| Yield Strength | 150 | 120 | 14 |
| Toughness | 0.92 | 0.23 | 0.42 |

The above greensheets 1 and B were then punched and metallized and formed into a laminate. The laminate was fired by pyrolyzing at up to 500° C. for 5 hours. The laminate was then heated in a BBO cycle as shown in the figure and then sintered at 1530 to 1580° C. for 4 hours. The MLC prepared using the heating cycle of the figure was commercially acceptable whereas the others formed using the BBO heating cycle shown by lines 10, 11 and 12 were not commercially acceptable.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A process for fabricating a multilayer ceramic substrate comprising:

stacking layers of greensheet made from a ceramic greensheet casting composition comprising alumina or other ceramic having a mean particle size of less than about 1 micron and being substantially unimodal, a binder resin, a solvent system and a plasticizer, the greensheets having a thickness of about 10 to 75 microns and having metallization thereon and metallized via interconnections;

and sintering the stack to form the multilayer ceramic substrate, the sintering being performed by: pyrolyzing the laminate;

heating to remove the remaining organics by heating the pyrolyzed laminate using a heating cycle comprising a first zone of heating within a temperature range between about 980° C. to about 1025° C., a second zone of maintaining the temperature between about 980° C. to about 1025° C. or ramping to a temperature within a temperature range up to about 1075° C., and a third zone of maintaining the temperature between about 980° C. to about 1075° C. or ramping to a temperature within a temperature range up to about 1075° C.; and then sintering.

2. The process of claim 1 wherein the laminate is heated between 980° and 1025° C. for about 1 to 2 hours followed by ramping the temperature within a temperature range up to about 1075° C. or maintaining the soak temperature until the organics are removed.

3. The process of claim 1 wherein the casting composition contains less than 1% by weight glass.

4. The process of claim 3 wherein the glass is less than 0.5%.

5. The process of claim 1 wherein the mean particle size is about 0.3 to 0.6 microns with a standard deviation of about ±0.25 micron.

* * * * *

UNITED STATES PATENT AND TRADEMARK OFFICE
CERTIFICATE OF CORRECTION

PATENT NO. : 5,948,193
DATED : September 7, 1999
INVENTOR(S) : Michael A. Cohn et al.

It is certified that error appears in the above-indentified patent and that said Letters Patent is hereby corrected as shown below:

In column 4, line 58, after "herein" insert -- to -- .

In column 8, line 12, delete "Polyvinyl Bolyral" and substitute therefor -- Polyvinyl butyral -- .

Signed and Sealed this

Third Day of April, 2001

Attest:

NICHOLAS P. GODICI

*Attesting Officer*     *Acting Director of the United States Patent and Trademark Office*